United States Patent [19]
Keller et al.

[11] 4,254,382
[45] Mar. 3, 1981

[54] CRYSTAL OSCILLATOR TEMPERATURE COMPENSATING CIRCUIT

[75] Inventors: Anthony F. Keller, Chicago; Albert V. Kraybill, Arlington Heights, both of Ill.

[73] Assignee: Motorola, Inc., Schaumburg, Ill.

[21] Appl. No.: 21,524

[22] Filed: Mar. 19, 1979

[51] Int. Cl.³ .......................... H03B 5/36; H03B 5/04
[52] U.S. Cl. .............................. 331/116 R; 331/176
[58] Field of Search ............... 331/176, 177 V, 116 R, 331/66

[56] References Cited
U.S. PATENT DOCUMENTS

| | | | |
|---|---|---|---|
| 3,831,111 | 8/1974 | Lafferty | 331/176 X |
| 3,970,966 | 7/1976 | Keller et al. | 331/176 X |
| 4,096,452 | 6/1978 | Waku et al. | 331/176 X |
| 4,107,629 | 8/1978 | Stone, Jr. | 331/176 X |

*Primary Examiner*—Siegfried H. Grimm
*Assistant Examiner*—Edward P. Westin

*Attorney, Agent, or Firm*—James A. Scheer; James W. Gillman

[57] ABSTRACT

An integratable circuit is utilized for generating a temperature varying control voltage to be applied to a varactor diode to temperature compensate a crystal oscillator. The temperature compensating circuit has a middle range circuit for creating a substantially linear current versus temperature variation in a middle temperature range, a cold-temperature range circuit operative below a predetermined temperature for creating a non-linear current versus temperature variation a hot-temperature range circuit operative above a predetermined temperature for creating a non-linear current versus temperature variation and circuitry for summing said currents and generating a voltage proportional to the current sum. The control circuit, which requires a regulated supply voltage, uses a diode string and differential amplifiers to generate the desired current versus temperature variation.

11 Claims, 8 Drawing Figures

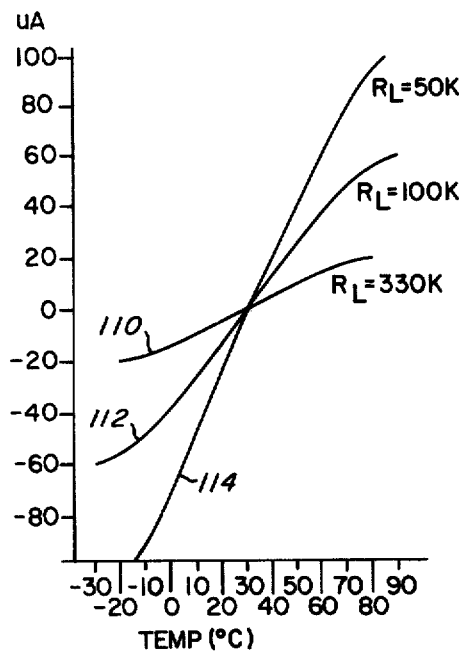
$\overline{\text{Fig}}.4$
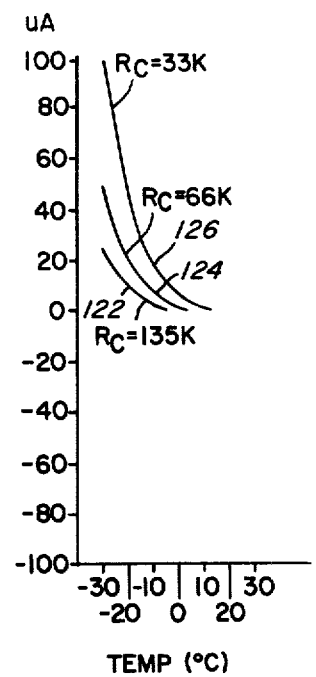
$\overline{\text{Fig}}.5$
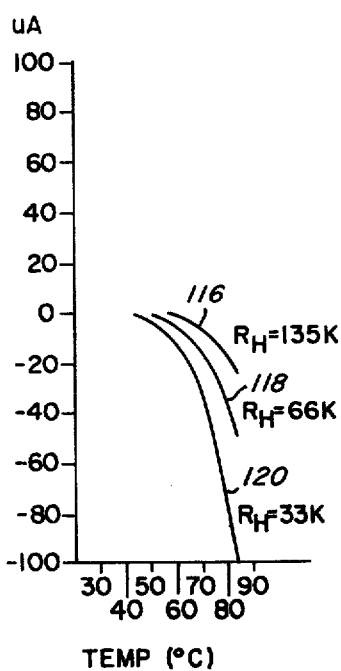
$\overline{\text{Fig}}.6$

| CURVE | $R_C$ K$\Omega$ | $R_L$ K$\Omega$ | $R_H$ K$\Omega$ |
|---|---|---|---|
| A | 60 | 385 | 60 |
| B | 88 | 149 | 88 |
| C | 149 | 88 | 149 |
| D | 385 | 60 | 385 |

CRYSTAL OSCILLATOR TEMPERATURE COMPENSATING CIRCUIT

BACKGROUND OF THE INVENTION

The invention relates generally to the field of temperature compensating circuits for crystal oscillators. In particular, the invention concerns a compensating circuit which creates a control voltage that is applied across a varactor diode for maintaining the frequency of a crystal oscillator at a substantially constant value as the temperature of the oscillator is varied.

Oscillators that have a frequency determining crystal are commonly used to provide a stable output frequency. However, the crystals used in such oscillators are temperature sensitive and therefore temperature compensating apparatus is normally required to maintain a stable oscillator output frequency. Two basic techniques are used for temperature stabilizing the crystal oscillator frequency. One method is to enclose the oscillator within an oven and thereby maintain the crystal at a constant temperature. This requires a large amount of space and consumes a substantial amount of power. Another method, which is the one generally adopted by the present invention, is to generate a temperature vaying voltage and apply it across a voltage variable capacitor (e.g. varactor diode) to control the resonant frequency of the crystal oscillator.

In many oscillators, the well known AT cut crystal is commonly used and it has a generally cubic frequency versus temperature characteristic having an inflection point at approximately 28° C. The exact frequency vs. temperature characteristics of individual AT cut crystals are quite variable depending on how the crystal was made. Thus in order to accurately compensate an oscillator using an AT cut crystal, the voltage applied to the varactor diode should have a temperature variation which is substantially similar to that of the particular crystal being used.

Some prior circuits have created a cubic law temperature varying voltage by twice multiplying a linearly varying voltage, but such systems are extremely complex and cannot be adequately and easily adjusted to fit the compensating voltage versus temperature curve which is required by any one particular crystal oscillator.

Another common method which partially compensates a crystal oscillator using AT cut crystals uses hot and cold temperature range networks to produce non-linear temperature variations in a control voltage above and below two predetermined temperatures, while applying a constant control voltage in a middle temperature range. In addition, temperature sensitive capacitors are also used in the crystal oscillator circuit to minimize the effect of the substantially linear frequency versus temperature variation of the crystal that exists in the middle temperature range. Such circuits only partially compensate the resonant crystal. They are also not suitable for applications in which the crystal is operated in an overtone mode of oscillation since temperature sensitive capacitors are then generally unable to adequately compensate for the linear variation in the middle temperature range.

A somewhat similar method, disclosed in U.S. Pat. No. 3,970,966, Keller et al., avoids the use of temperature sensitive capacitors and produces a more accurate result. This approach uses a circuit that produces a substantially linear voltage versus temperature variation including a point of inflection in the middle temperature range and a substantially non-linear voltage versus temperature variation in hot and cold temperature ranges. Each temperature range circuit includes a thermistor and a transistor which together control the operative range and the magnitude of the temperature variation contributed by each of the circuits. Although this approach is adequate for many applications, it is not suitable for more demanding applications requiring more precise temperature stability over a wide temperature range.

Still another method of producing a temperature compensating control voltage is to use a thermistor and a series of Zener diodes having different breakdown voltages to create a piecewise non-linear voltage that is adjusted to fit a desired curve. A disadvantage of this system is that any adjustment of an individual piecewise non-linear section, will affect a number of other sections and require their readjustment, which will in turn require other subsequent adjustments. An additional disadvantage is that many components are needed to create an adequately fitting composite curve. This composite curve has abrupt changes in slope for every piecewise section and therefore perfect compensation is never feasible. Also, the design of the compensating network is difficult because Zener diodes are available with only certain discrete breakdown voltages.

SUMMARY OF THE INVENTION

It is therefore an object of this invention to provide an improved temperature compensating circuit for a crystal oscillator which overcomes the aforementioned deficiencies.

It is another object of the invention to provide an improved temperature compensating circuit for crystal oscillators which is easily adjusted to fit any particular crystal oscillator and which can be readily manufactured in integrated circuit form.

A more particular object of the invention is to provide a temperature compensating circuit which includes a first circuit for independently creating a current having a substantially linear temperature variation in a middle temperature range, a second circuit for modifying the current to provide it with a non-linear temperature variation and a change of slope polarity in either a hot or cold temperature range, and a third circuit to provide a control voltage proportional to the composite current.

In the preferred embodiment of the present invention an improved temperature compensating integrated circuit for an oscillator having a frequency determining crystal and operative in cold, middle and hot temperature ranges is provided and comprises: an integrated voltage regulator; compensating means for generating a control voltage with a voltage versus temperature characteristic having a substantially linear variation in the middle temperature range, a substantially non-linear variation and a change of slope polarity in each of the hot and cold temperature ranges, and means for coupling the control voltage to a voltage variable reactance means whereby the oscillator frequency is maintained at a substantially constant value over all of the temperature ranges.

In the basic approach used by the subject invention, a crystal oscillator is compensated by applying a compensating voltage having a predetermined voltage versus temperature characteristic across the varactor diode which controls the resonant frequency of the crystal oscillator. The novel compensating circuit includes a first circuit which independently generates a linear middle range temperature variation, a second circuit, which independently generates the desired nonlinear variation in a cold temperature range, a third circuit for independently generating a non-linear variation in a hot temperature range, and finally circuitry for combining the output of the three circuits and generating a control voltage with the same temperature variation. Since the second and third circuits independently control the non-linear variation in the hot and cold temperature ranges, these circuits can be independently adjusted to create any desired non-linear variation. Therefore, by adjusting the middle range variation and subsequently adjusting the hot and cold range variation, any crystal oscillator can be temperature compensated by the present invention.

In addition, the first circuit provides the control signal with the point of inflection in the middle temperature range. Since differential amplifiers are used for generating the currents, this is accomplished by adjusting the linear circuit such that the differential amplifier is balanced at the point of inflection. The point of inflection is required to accurately compensate for the crystal variation which also has a point of inflection. The first circuit is operative in the cold, middle and hot temperature ranges and besides creating and linear temperature variation in the middle range, it also creates a non-linear temperature variation in the hot and cold temperature ranges. The second and third circuits generate a net current for modifying the temperature variation only in their respective temperature ranges and therefore adjusting one of them does not affect the other. The operative range of each of the three differential amplifiers is determined by a string of four diodes which determines one input level and a fixed voltage input which is established by a resistor voltage divider. The magnitude of the variation contributed by each of the circuits is substantially determined by a set of adjustable resistors coupled to the bias network of each differential amplifier.

BRIEF DESCRIPTION OF THE DRAWINGS

FIG. 4 is a graphical representation of the current versus temperature characteristics of the mid-temperature range current generator for three different values of adjusting resistors.

FIG. 5 is a graphical representation of the current versus temperature characteristics of the cold-temperature range current generator for three different values of adjusting resistors.

FIG. 6 is a graphical representation of the current versus temperature characteristics for the hot-temperature range current generator for three different values of adjusting resistors.

DETAILED DESCRIPTION OF THE PREFERRED EMBODIMENT OF THE INVENTION

Figure 1:
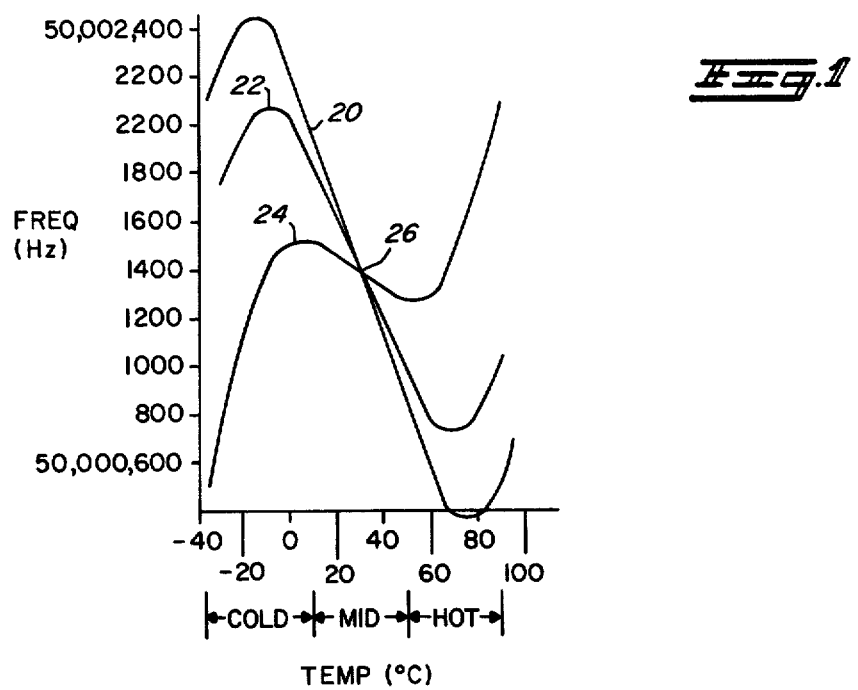
FIG. 1 is a graphical representation of the frequency versus temperature characteristics of three typical AT cut crystals.

Referring to FIG. 1, three frequency versus temperature curves 20, 22 and 24 are illustrated for three different uncompensated AT cut crystals. Each of the curves is shown as having a generally cubic (third order) shape including a non-linear portion which undergoes a change in slope polarity in a cold temperature range ($-40°$ C. to approximately $+10°$ C.), a substantially linear portion having a point of inflection at 26 in the mid temperature range ($+10°$ C. to $+50°$ C.), and a non-linear portion which undergoes another change in slope polarity in a hot temperature range ($+50°$ C. to $+95°$ C.). A change in slope polarity is defined as a change from positive slope to negative slope or vice versa.

Curves 20, 22 and 24 have their corresponding points of inflection at the same point 26 that is at approximately $28°$ C., which is characteristic for all AT cut crystals. They differ slightly from each other in the temperatures at which they undergo their respective changes in slope polarity but they differ substantially from each other in the magnitude of the slope of their respective linear middle range portions. Thus, FIG. 1 shows that AT cut crystals can have substantially different frequency versus temperature characteristics. Therefore, any effective compensating circuit must be capable of being adjusted to provide temperature compensation for a crystal having characteristics similar to any of the curves illustrated in FIG. 1.

Figure 2:
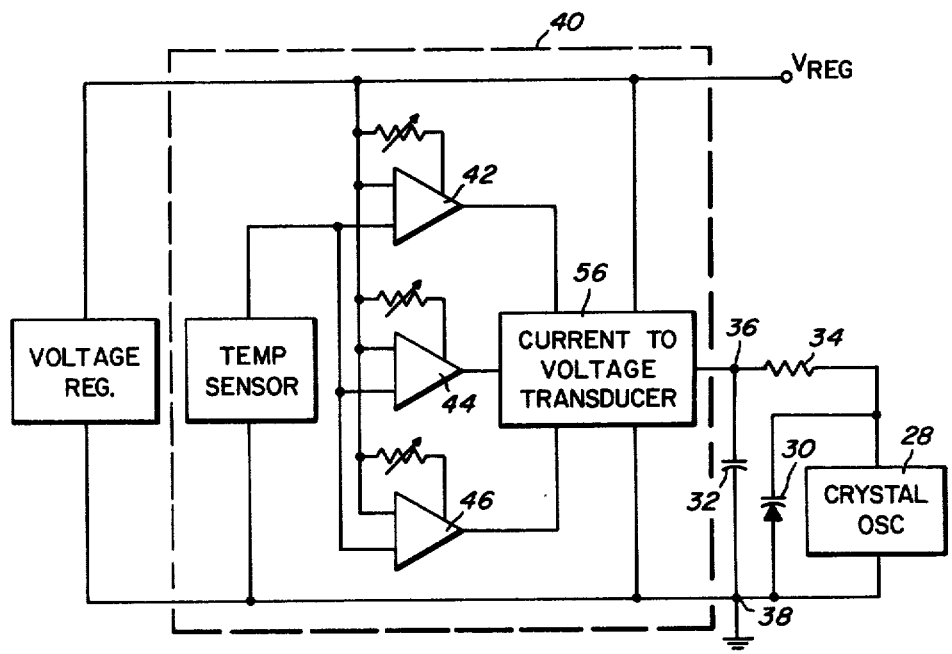
FIG. 2 is a block diagram of a crystal oscillator and the temperature compensating circuit of the present invention.

In FIG. 2, a crystal oscillator 28 is temperature compensated by the voltage generating circuit 40 supplying a control voltage to a varactor diode 30 which is connected to the oscillator for controlling its resonant frequency. The details of the oscillator 28 and its connection to the varactor 30 are not shown since the technique for controlling the resonant frequency of a crystal oscillator by applying a voltage to a varactor diode is well known in the state of the art. The voltage generating circuit 40 produces the control voltage across output terminals 36 and 38 which have an RF bypass capacitor 32 connected therebetween. The terminal 36 is connected to the cathode of the varactor 30 and to the oscillator 28 through an isolating resistor 34. The terminal 38 is connected to ground, to the anode of the varactor 30 and to the oscillator 28.

The control voltage applied to the varactor 30 should have a voltage versus temperature characteristic that is similar to the frequency versus temperature characteristic of the crystal and the oscillator 28. Preferably, the varactor should be a hyper-abrupt diode that 'ias a substantially linear voltage versus reactance characteristic. When AT cut crystals are used, a control voltage characteristic similar to one of the curves shown in FIG. 1 is required.

As shown in FIG. 2, the voltage generating circuit 40 is basically composed of a temperature sensor, a linear middle temperature range current generating differential amplifier 44, a non-linear cold-temperature range current generating differential amplifier 46, a non-linear hot temperature range current generating differential amplifier 42, and a current-to-voltage transducer 56.

The temperature sensor is coupled to the input of each differential amplifier to establish a temperature dependent input voltage level. The other input of each differential amplifier is coupled to the regulated power supply voltage to establish a fixed voltage level input. Thus the input to each amplifier is a temperature dependent differential voltage. The output current of each of these differential amplifier current generating circuits is coupled to the current-to-voltage transducer which produces a control voltage across terminals 36 and 38 which has the same temperature dependence as the input current sum. A voltage regulator is also shown in FIG. 2 and would be an integral part of the circuit in the integrated circuit form of the preferred embodiment.

Figure 3:
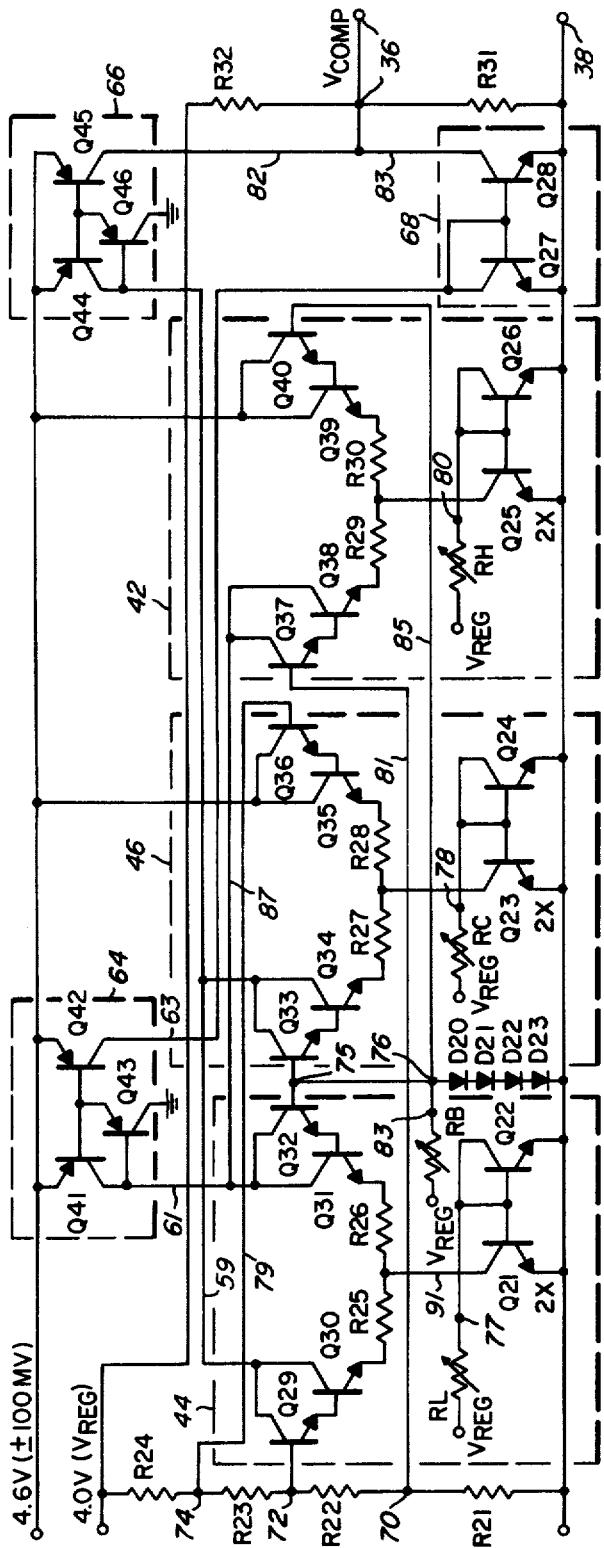
FIG. 3 is a schematic diagram of the preferred embodiment of the present invention.

FIG. 3 is a schematic diagram of the preferred embodiment of the invention which is specifically designed to be fully integrated with the exception of the adjusting resistors. The regulated power supply circuit is not shown because there are a great variety of such circuits that are well known in the art. The middle temperature range current generating circuit 44 is a Darlington pair differential amplifier composed of transistors Q29, Q30, Q31 and Q32 resistors R25 and R26, and the current mirror composed of transistors Q21 and Q22. A fixed input voltage developed by the resistor string R21, R22, R23 and R24 connected across a regulated supply voltage is coupled to the left input (Q29) of differential amplifier 44 at node 72. The temperature-dependent voltage developed across the diode string D20, D21, D22 and D23 is coupled to the right input, Q32, of differential amplifier 44 at node 75. Thus differential amplifier 44 will have a temperature-dependent differential input.

The left side of differential amplifier 44 is connected directly through conductor 59 to transistor Q44 of the current mirror 66 so that the current from the left side will be coupled directly into the current mirror. This current will be reflected through to transistor Q45 and directed down through conductor 82. The right side of differential amplifier 44 is coupled directly through conductor 61 to transistor Q41 of current mirror 64 so that the current into Q41 is reflected through to Q42. This current flows directly through conductor 63 to Q27 of current mirror 68 and is reflected through to Q28 and down through conductor 83. The result is that the differential current will flow into node 36, generating a voltage across R31 which will add to the residual voltage developed by the resistor string R31 and R32. The differential current which flows into node 36 is plotted for three different values of adjusting resistors RL in FIG. 4. These curves show a current which is substantially linear in the middle temperature range with an inflection point at approximately 28° C. The exact frequency vs. temperature characteristic of the differential current is determined by the value of adjusting resistors $R_L$ and $R_B$, the value of resistors R25 and R26, and the value of the fixed voltage generated at node 72. Therefore, the additive voltage developed across R31 by this differential current will have exactly the same temperature dependence.

For example, at the temperature at which differential amplifier 44 is balanced (at 28° C.) the fixed voltage at node 72 will be equal to the temperature dependent voltage at node 75. Therefore, the current in the right branch of differential amplifier 44 will be equal to the current in the left branch and the current therefore will be reflected through the current mirrors (64, 66, 68) to transistors Q45 and Q28. The current flowing down through Q45 will be the current of the left branch of the differential amplifier 44 and the current flowing down through Q28 will be the current of the right branch of differential amplifier 44. Since these two currents will be equal, there will be no differential current flowing into node 36 and the resulting voltage across R31 will be the residual voltage. However, at a temperature above the balance temperature, the voltage developed across the diode string D20, D21, D22, and D23 will be less, so that the differential input voltage (across nodes 72, 75) will now not be equal to zero. The current in the right branch will be less than the current in the left branch and the current flowing down through Q28 will be less than the current through Q45. Therefore, the difference between these two currents will flow into node 36 and develop an additional voltage across R31 so that the output voltage across terminals 36 and 38 will be increased by the increase in current. This change in output voltage will have the same temperature variation as the differential current plotted in FIG. 4.

In differential amplifier 44 the current mirror is composed of transistors Q21 and Q22, and adjusting resistor $R_L$. The current mirror is used as a current source supplying the differential amplifier through conductor 91, and $R_L$ (Range 60K–400K) is an adjusting resistor which is coupled to the four volt regulated supply voltage (indicated as $V_{reg}$). This adjusting resistor allows the circuit to be adjusted for various different crystals. The smaller the value of this resistor the greater the current of the current source and the greater the resulting slope of the temperature dependent differential current curve as illustrated in FIG. 4.

The cold temperature range current generating circuit in FIG. 3 is differential amplifier 46 composed of transistors Q33, Q34, Q35 and Q36, resistors R27 and R28, and the current mirror composed of transistors Q23 and Q24. The temperature dependent input voltage developed at node 76 is connected to the left side of this differential amplifier, Q33 and the fixed bias voltage generated at node 74 is connected, through conductor 79, to the right side, Q36, of differential ampliffier 46. This generates a differential input which is temperature dependent. The right side of differential amplifier 46 is connected directly to the 4.6 volt power supply voltage while the output current of the left side of the differential amplifier 46 is combined with the current of the left side of differential amplifier 44 in conductor 59 into transistor Q44 of current mirror 66. The result is that the current reflected down through transistor Q45 of current mirror 66 through conductor 82 is a combination of the current from the linear circuit and the cold-range circuit. The current generated by this nonlinear cold-temperature range current generating circuit is shown for three different values of adjusting resistors in FIG. 5. Thus when the temperature decreases, the voltage across the diode string will increase, and therefore the current in the left branch of differential amplifier 46 will increase. This will cause an increase in current through transistor Q44 of current mirror 66 and therefore an increase in current down through transistor Q45 and conductor 82. Since there will be no increase in current through Q28 of current mirror 68, the current into node 36 will increase developing an increase in voltage across R31. The temperature dependence of the increased current is illustrated in the curves of FIG. 5.

The current mirror composed of transistors Q23 and Q24, and adjusting resistor $R_C$ is the current source driving the differential amplifier 46. Since $R_C$ is connected to the four volt regulated power supply voltage ($V_{reg}$) the value of $R_C$ (Range 60K–400K) will determine the current flowing through Q24 and therefore the current through Q23. This permits the exact non-linear temperature dependence of the output current to be adjusted to match any given crystal as illustrated by the three curves of FIG. 5.

The hot temperature range non-linear current generating circuit of FIG. 3 is the Darlington pair differential amplifier 42 composed of transistors Q37, Q38, Q39 and Q40, resistors R29 and R30, and the current source composed of transistors Q25 and Q26. The fixed voltage developed at node 70 is coupled through conductor 81 to the left input of differential amplifier 42, Q37, and the temperature-dependent voltage developed at node 76 is coupled through conductor 85 to the right input of differential amplifier 42, Q40. The right side (Q40) of this differential amplifier 42 is connected directly to the 4.6 volt power supply voltage and the output current of the left side (Q37) is combined, through conductor 87, with the current in conductor 61 from the right side of the linear differential amplifier 44 into transistor Q41 of current mirror 64. This current is reflected through to transistor Q42 to transistor Q27 of current mirror 68 via conductor 63. The result is that the combined current is reflected down through Q28 of current mirror 68. Therefore, as the temperature increases into the hot-temperature range, the voltage developed at node 76 decreases resulting in an increase in current in the left side of the differential amplifier 42 and thus an increase in current down through transistor Q28 of current mirror 68 and through conductor 83. Since there is no corresponding increase in current through Q45 the additional current must be drawn out of node 36 resulting in a decrease in voltage across R31. FIG. 6 is a plot of the current of the left side of differential amplifier 42 versus temperature for three different values of adjusting resistor $R_H$. The voltage decrease developed across terminals 36 and 38 as a result of the current of differential amplifier 42 will therefore have the same temperature dependence as the curves shown in FIG. 6.

The current mirror composed of transistors Q25 and Q26 is the current source supplying the differential amplifier 42. Since $R_H$ is connected to the four volt regulated power supply voltage ($V_{reg}$), the value of $R_H$ (Range 60K–400K) can be adjusted to control the current through Q26 and thus the current through Q25 driving the differential amplifier. This allows the non-linear temperature versus current characteristics of the differential amplifier output current to be adjusted over a wide range as illustrated by the three curves of FIG. 6.

The resistor $R_B$ connected between the four volt regulated power supply ($V_{reg}$) and node 83 in FIG. 3 is provided to compensate for variations in circuit parameters that results from the integrating process. By adjusting this resistor the voltage developed at node 76 can be adjusted so that the exact temperature at which differential amplifier 44 is balanced (i.e. the differential input is zero) can be set to the desired 28° C. This balance point is the point of inflection in the linear curve for the mid-temperature range.

Figure 7:
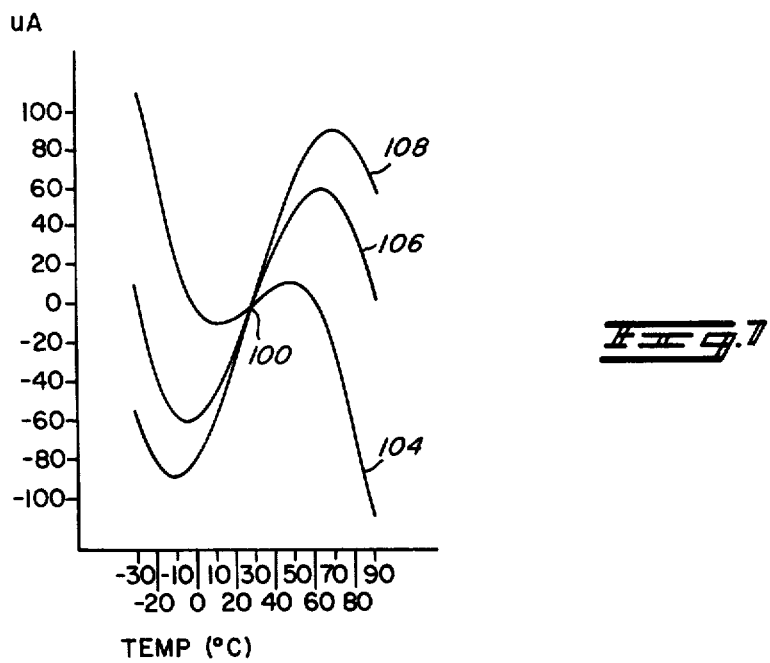
FIG. 7 is a graphical representation of the total current sum versus temperature characteristics for three different values of adjusting resistors.
Figure 8:
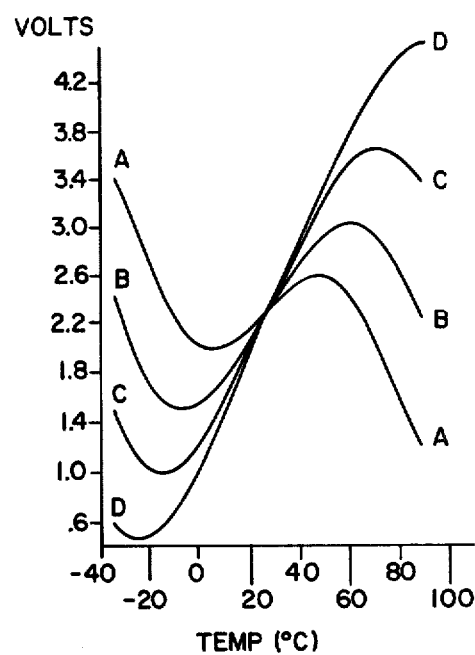
FIG. 8 is a graphical representation of the output voltage versus temperature for the preferred embodiment of the present invention for four combinations of linear, cold and hot adjusting resistor values.

Current mirrors 64, 66 and 68 together with resistor string R31 and R32 form the current-to-voltage transducer. Since this embodiment of the invention was made as an integrated circuit, the easily integratable current mirrors were chosen for this function. The residual output voltage across the terminals 36 and 38 developed at the balance point is simply the voltage divider result of the string R31 and R32 since there is no current flowing into node 36 at the balance point temperature (approx. 28° C.). The composite current flowing into node 36 is shown in FIG. 7 for three different values of the adjusting resistors. The current at the common inflection point 100 for the three curves 104, 106, 108 can be seen to be zero. In order to get the desired compensation, a non-zero DC voltage must exist across the output at the inflection point. The resistor string R31 and R32 establishes this voltage. The resulting voltage versus temperature characteristics for four different sets of adjusting resistor values are shown in FIG. 8. It can be seen that the voltage at the common inflection point 102 is approximately 2.2 volts. These curves of FIG. 8 clearly show the compensating voltage versus temperature variation of the type needed to compensate a crystal with temperature versus frequency characteristics such as those shown in FIG. 1.

The four volt regulated supply, required by the circuit of FIG. 3, but not shown, is important to the proper operation of the circuit due to the nature of the circuits used. For example, the differential amplifier current outputs are dependent upon the differential input values which are dependent volt regulated supply and the resistor string at nodes 70, 72 and 74. In addition, the voltage generated across R31 is dependent upon the four volt regulated supply since that resistor string is merely a resistor voltage divider. However, any temperature dependence of the regulated supply can be compensated within a reasonable range by the adjusting resistors $R_L$, $R_C$ and $R_H$. Therefore, as long as the temperature dependence of the voltage regulator is fixed, it can be compensated for at the time that the resistors are adjusted to match the circuit to the particular crystal being used.

As a result in the preferred embodiment, the four volt regulated supply regulator (less than +1mv/°C.) is integrated on the same chip with the compensating circuit. This eliminates concern about variations in temperature dependence of an external regulated power supply.

The integrated circuit embodiment of the invention described is appropriate for a process optimized for an npn semiconductor configuration. The current mirrors in FIG. 3 associated with resistors $R_L$, $R_H$, $R_C$ are designed with a multiplication factor of 2, so that the current of the left side is twice the current of the right side. The four adjusting resistors $R_L$, $R_C$, $R_H$ and $R_B$ are connected to external pins at nodes 77, 78, 80 and 83 respectively. These resistors may be, for example, laser trimmable thick film resistors which can be easily and accurately adjusted in manufacture. This, together with the repeatability and lower tolerance error in such devices as diodes on integrated circuits, results in a compensating circuit which is more accurate over a wider temperature range than prior art devices.

In a typical embodiment of the invention fabricated by the inventor using an AT cut crystal with frequency stabilities of 10–30 parts per million, compensation to less than 2 parts per million over a temperature range of −40° to +95° C. was possible when the component values in the following table were used:

R21: 43.6 Kohms
R22: 9 Kohms
R23: 9 Kohms
R24: 18.4 Kohms
R25: 2.5 Kohms

R26: 2.5 Kohms
R27: 500 ohms
R28: 500 ohms
R29: 500 ohms
R30: 500 ohms
R32: 34 Kohms
R31: 46 Kohms
RL, RC, RH: 60–400 Kohms
RB: 20 K–80 Kohms While a preferred embodiment of the invention has been described and shown, it should be understood that other variations and modifications may be implemented. It is therefore contemplated to cover by the present application any and all embodiments and variations that fall within the true spirit and scope of the basic underlying principles disclosed and claimed herein.

What is claimed is:

1. A temperature compensating circuit for an oscillator having a frequency determining crystal, and a voltage variable reactance coupled to the crystal for varying the oscillator frequency in response to a control voltage applied to said reactance, comprising:

first current generating means for independently creating a substantially linear current versus temperature variation in a middle temperature range and a non-linear variation in both a hot and a cold temperature range;

second current generating means for creating a substantially non-linear current versus temperature variation in said cold temperature range, said second current generating means including circuitry for independently determining the operative temperature range of said second current generating circuit;

third current generating means for creating a substantially non-linear current versus temperature variations in said hot temperature range, said third current generating means including circuitry for independently determining the operative temperature range of said third current generating circuit;

first current mirror means, coupled to the first current generating means and the third current generating means, for summing currents of said first and third current generating means to produce a first current sum;

second current mirror means, coupled to the first current generating means and the second current generating means, for summing currents of said first and second current generating means to produce a second current sum;

means for summing the currents of said first and second current mirror means to produce a total current sum, and for generating a control voltage with the same temperature variation as said total current sum; and means for coupling said control voltage to said reactance means whereby said oscillator frequency is maintained at a substantially constant value over all of said temperature ranges.

2. A temperature compensating circuit according to claim 1 wherein said first current generating means includes means for creating an inflection point in said middle temperature range.

3. A temperature compensating circuit according to claim 2 wherein said second and third current generating means includes means for creating a change of slope polarity in said cold and hot temperature ranges.

4. A temperature compensating circuit according to claim 3 wherein said first, second and third current generating means include a temperature sensing element.

5. A temperature compensating circuit according to claim 4 wherein each of said current generating means includes adjusting means for independently determining the magnitude of the control voltage versus temperature variation contributed by it.

6. A temperature compensating circuit according to claim 4 wherein said temperature sensing element is a string of diodes.

7. A temperature compensating circuit according to claim 2 or claim 5 further comprising:
   means for generating a regulated supply voltage.

8. A temperature compensating circuit according to claim 7, further comprising:
   adjusting means for determining the temperature at which said inflection point occurs.

9. A temperature compensating circuit according to claim 8 wherein said first, second and third current generating means each include a different amplifier for generating the temperature dependent current.

10. A temperature compensating circuit according to claim 9 wherein all circuitry, excluding all said adjusting means, are integrated on a single semiconductor substrate.

11. A temperature compensating circuit according to claim 9 wherein each said differential amplifier includes a current mirror current source.

* * * * *